United States Patent [19]

Arques

[11] Patent Number: 4,685,117

[45] Date of Patent: Aug. 4, 1987

[54] BASE CLIPPING PROCESS FOR A SOLID STATE PHOTOSENSITIVE DEVICE

[75] Inventor: Marc Arques, Grenoble, France

[73] Assignee: Thomson-CSF, Paris, France

[21] Appl. No.: 684,470

[22] Filed: Dec. 21, 1984

[30] Foreign Application Priority Data

Dec. 27, 1983 [FR] France ............... 83 20846

[51] Int. Cl.[4] .......................................... H03K 23/46
[52] U.S. Cl. ................................. 377/60; 358/213.26
[58] Field of Search .................. 377/60, 58, 57, 63; 357/24 R; 307/607; 358/213

[56] References Cited

U.S. PATENT DOCUMENTS

| 3,969,634 | 7/1976 | Su et al. ................. | 377/57 |
| 4,001,501 | 1/1977 | Weimer ................... | 377/58 |
| 4,139,784 | 2/1979 | Sauer ..................... | 377/57 |
| 4,375,597 | 3/1983 | Kosonocky ............... | 377/63 |
| 4,506,299 | 3/1985 | Berger et al. ........... | 358/213 |
| 4,611,234 | 9/1986 | Berger et al. ........... | 358/213 |

OTHER PUBLICATIONS

IEEE Transactions on Electron Devices, vol. ED-29, No. 1, Jan. 1982, pp. 3-13, New York (USA); K. Chow et al.; "Hybrid Infrared . . . ".
Patents Abstracts of Japan, vol. 7, No. 251 (E-209) (1396), Nov. 8, 1983; & JP-A-58 139465 (Matsushita Denki Sangyo K.K.) (8-18-83).
1978 IEEE International Electron Devices Meeting, Technical Digest, Washington, 406 Dec. 1978, pp. 517-521, New York, (USA); P. Felix et al.

Primary Examiner—Stanley D. Miller
Assistant Examiner—K. Ohralik
Attorney, Agent, or Firm—Roland Plottel

[57] ABSTRACT

A method of operating a solid state photodetector device which has N photodetectors formed on a first substrate portion connected to a readout stage, through a transition zone having at least one storage zone and a transfer gate, and a multiplexer of the charges transfer type which are on a second substrate portion. The second substrate portion is biased to a voltage which is negative with respect to that of the first substrate portion. Then, after integration of the charges from the photodetectors and tansfer thereof into the multiplexer in the usual way by leaving a charge Qo in the storage zone, the transfer gate is biased so that the voltage under this gate is less than the biasing voltage of the first substrate portion. Then the gate in the storage zone is biased so that the potential under this gate is between the bias voltage of the first substrate portion and the potential under the transfer gate so as to remove the charge Qo.

4 Claims, 14 Drawing Figures

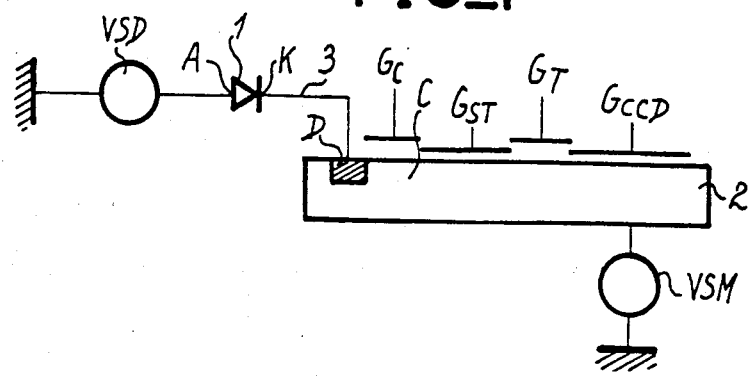
PRIOR ART FIG_1
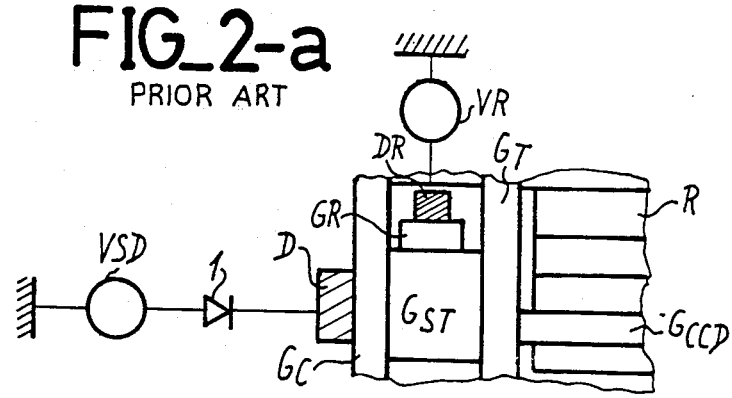
FIG_2-a
PRIOR ART
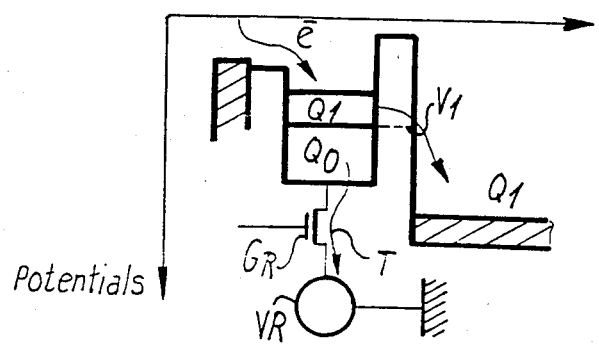
PRIOR ART FIG_2-b

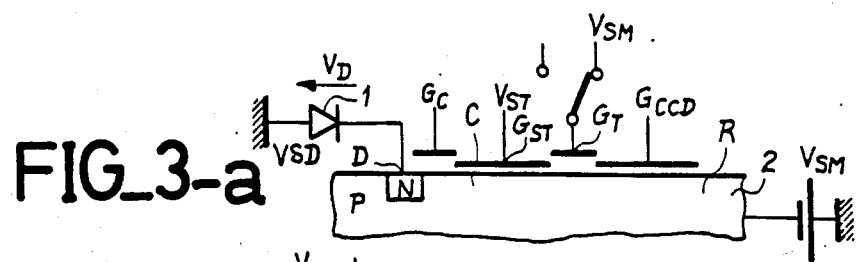
FIG_3-a
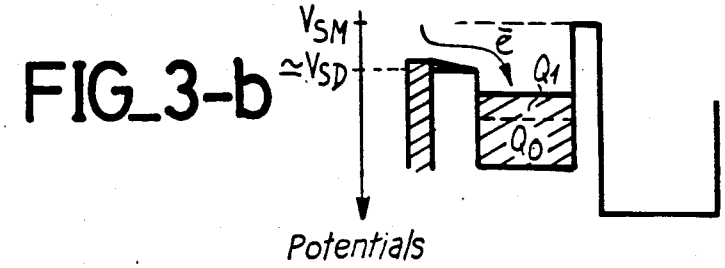
FIG_3-b
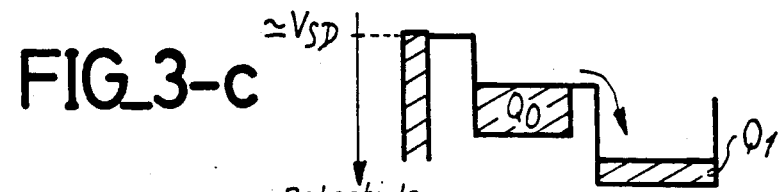
FIG_3-c
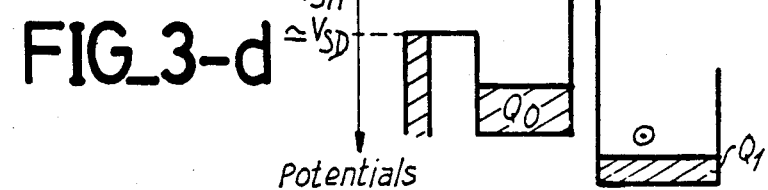
FIG_3-d
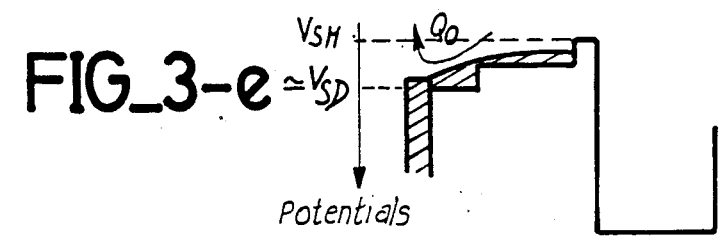
FIG_3-e
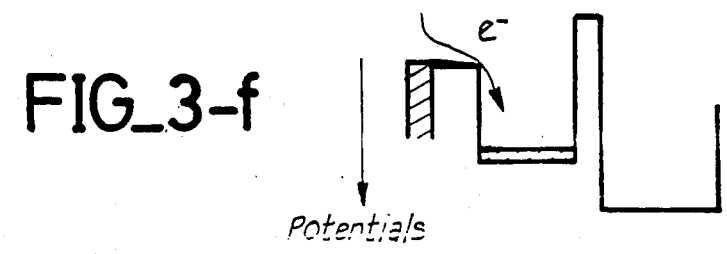
FIG_3-f

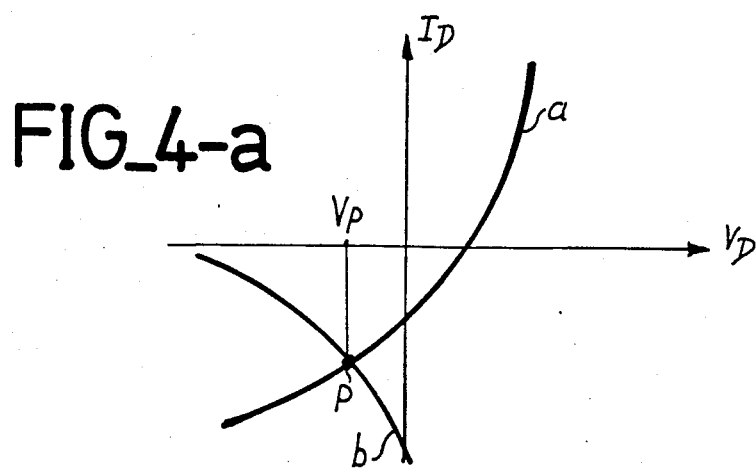
FIG_4-a
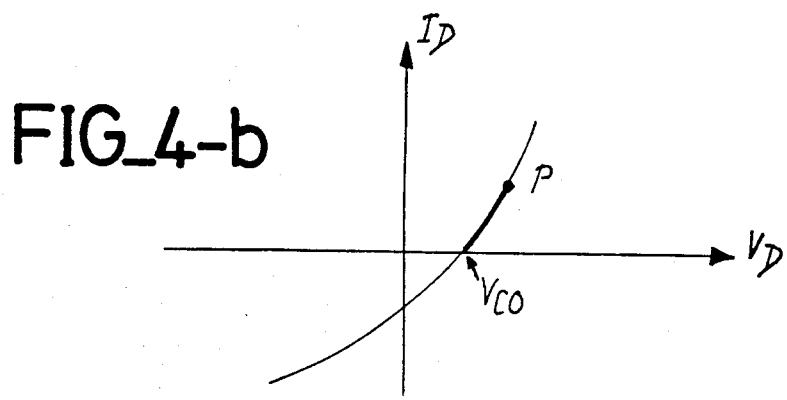
FIG_4-b
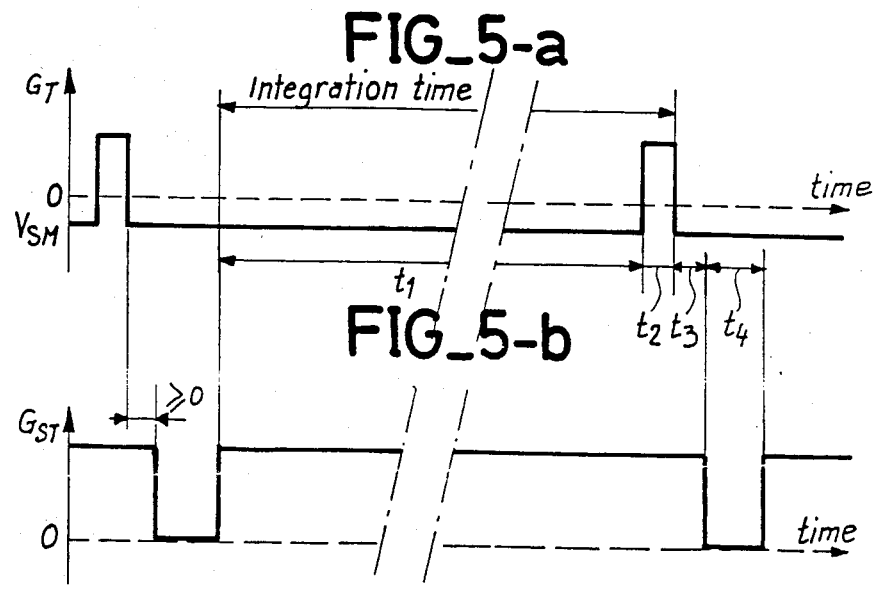
FIG_5-a
FIG_5-b

FIG_6
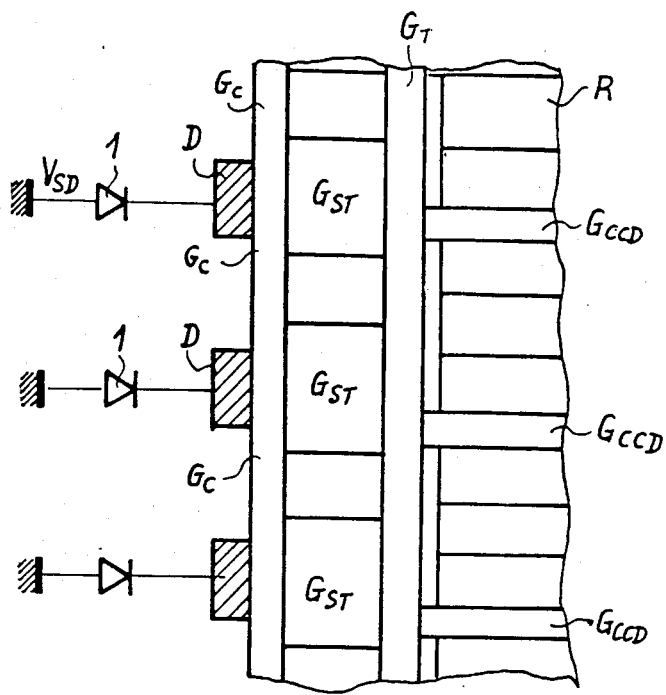

BASE CLIPPING PROCESS FOR A SOLID STATE PHOTOSENSITIVE DEVICE

BACKGROUND OF THE INVENTION

1. Field of the Invention

The present invention relates to solid state photosensitive devices, more particularly solid state photosensitive devices for infrared operation.

2. Description of the Prior Art

The photosensitive devices used at present are formed mainly by N photodetectors connected through a transition zone to a multiplexer preferably formed by a charge transfer shift register with N parallel inputs and a series output. More specifically and, as shown in FIGS. 1 and 2a which are respectively a cross sectional view and a top view of a photosensitive device of the prior art formed mainly by a hybrid circuit, namely a circuit in which the photodetectors are formed on a first substrate whereas the transition zone and the shift register are formed on a second substrate 2, the photodetectors used are photodiodes 1 whose anode A receives a biassing voltage $V_{SD}$ whereas the cathode K is connected by a connection to the charge integration zone. The charge integration zone comprises a readout diode D formed by a diffusion of a type opposite that of substrate 2. This diode D is connected by connection 3 to the cathode K of the photodiode 1. A control gate $G_C$ separates each diode D from a charge storage capacity C formed by a gate $G_{ST}$, an insulating layer and the substrate. In the Figures, for the sake of clarity, the layer of insulation which separates the different gates from the surface of the semiconductor substrate 2 has not been shown. A transfer gate $G_T$ separates each capacity C from a stage $G_{CCD}$ of the charge transfer shift register R having parallel inputs and a series output.

However a charge transfer shift register has the disadvantage of offering only a limited storage possibility, which consequently limits the maximum charge which may be transferred from the storage capacities into said register.

This is particularly troublesome in the case of infrared. In fact, in this case temperature variations are read out and the useful information is superimposed on a background charge which may be relatively high but which is of no interest from the point of view of the signal.

Consequently, it has been proposed to eliminate at least a part of this background charge before transferring it into the shift register. For this base-clipping, as shown in FIG. 2a, on the side of each storage gate $G_{ST}$ there is provided a gate $G_R$ and a diffusion $D_R$ of a type opposite that of the substrate connected to a reset voltage $V_R$. The gate $G_R$ is controlled by a potential which is brought to a high level once the charges have been transferred into the shift register, so as to level again the corresponding storage capacity.

The operation of this device will now be explained with reference to FIG. 2b which shows the surface potentials of the different elements of FIG. 2 in substrate 2. During integration, the photoelectrons $e^-$ delivered by the photodiode are stored under the storage gate $G_{ST}$. During this charge integration period, the relevelling MOS T transistor whose induced source is formed by the storage capacity, whose gate is formed by gate $G_R$ and drain by diffusion $D_R$, is disabled, that is to say that gate $G_R$ is at a low level. At the end of the integration time, a charge amount Q is obtained under the storage gate $G_{ST}$. This charge Q may be expressed in the form $Q_0+Q_1$ in which $Q_0$ designates the part of the background charge or pedestal which may be eliminated. Then the potential barrier under the transfer gate $G_T$ is lowered to the level $V_1$ shown with a broken line in FIG. 2b so that the charge $Q_1$ is transferred under the stage $G_{CCD}$ of the shift register. Then the potential barrier under $G_R$ is brought to a high level by increasing the biassing voltage of this gate so as to enable the relevelling MOS T transistor, which allows the charge $Q_0$ to be removed towards the reset voltage $V_R$. The potential barriers under gates $G_R$ and $G_T$ are brought to a low level and a new charge integration begins.

This base clipping process has the main drawback of requiring a gate $G_R$ and a diffusion $D_R$ for each photodiode—multiplexer coupling point as well as additional connections for biassing these two elements. This causes an increase of the surface of the readout circuit. Another disadvantage of this base clipping process resides in the control electronics which must comprise two additional voltages and in the connections which comprise two additional wires.

Consequently, the aim of the present invention is to propose a new base clipping process which allows the same function to be obtained without complicating the structure of the solid state photosensitive device.

SUMMARY OF THE INVENTION

The present invention provides then a base clipping process for a solid state photosensitive device comprising N photodetectors formed on a first substrate and connected through a transition zone comprising at least one storage zone and one transfer gate and through a multiplexer of the charge transfer type, to a read out stage in which at least the transition zone and the multiplexer are formed on a second substrate, in which process the second substrate is biassed to a negative voltage with respect to that of the first substrate, then, after integration of the charges and transfer thereof into the multiplexer in the usual way by leaving a charge $Q_0$ in this storage zone, the transfer gate is polarized so that the potential under this gate is less than the biassing voltage of the first substrate, and the storage gate is polarized so that the potential under this gate is between the biassing voltage of the first substrate and the potential under the transfer gate so as to remove the charge $Q_0$ towards the photodetectors.

So that the invention may be applied, the semiconductor substrate having the detectors and that having the integration zones and the multiplexer must be able to be biassed differently.

Consequently, the present invention applies particularly well to photosensitive devices formed by a hybrid circuit in which the substrate carrying the photodetectors is independent of the substrate carrying the integration zones. However, the present invention may also be applied to a photosensitive device formed on a single semiconductor substrate. In this case, the part of the substrate with the photodetectors and that with the integration zones and the multiplexer are separated for example by means of insulating wells so as to be able to be polarized differently.

BRIEF DESCRIPTION OF THE DRAWINGS

Other features and advantages of the present invention will appear from reading the following description with reference to the accompanying drawings in which:

FIG. 1, already described, is a cross sectional view of a solid state photosensitive device of the prior art;

FIGS. 2a and 2b, already described, are respectively a top view of a photosensitive device of the prior art comprising in each storage zone a charge removal device for implementing the base clipping process at present used and FIG. 2b shows the surface potentials in the substrate during use of said base clipping process;

FIGS. 3a to 3f are respectively a schematical sectional view of one embodiment of a solid state photosensitive device used for implementing the process of the present invention and diagrams showing the evolution as a function of time of the surface potentials in the substrate;

FIGS. 4a and 4b are the voltage-current characteristics of the photodiodes respectively during charge integration and during removal of the charge $Q_0$;

FIGS. 5a and 5b are diagrams as a function of time of the voltages applied to the transfer gate $G_T$ and to the charge storage gate $G_{ST}$ respectively.

FIG. 6 is a schematic sectional view of the invention showing N photodetectors.

In the different Figures the same references designate the same elements but for the sake of clarity the sizes and proportions of the different elements have not been respected.

DESCRIPTION OF THE PREFERRED EMBODIMENT

FIG. 3a shows a sectional view of a photosensitive device used for implementing the base clipping process of the present invention. This photosensitive device has a structure identical to that of a photosensitive device of the prior art not comprising a charge removal MOS transistor. The photosensitive device of FIG. 3a is a hybrid circuit, that is to say a circuit in which the photodiodes 1 are integrated on a first substrate whereas the transition zone and the charge transfer read out register are formed on a second substrate. This type of circuit is more particularly used in the infrared field. In this case, the first substrate on which the photodiodes 1 are formed is constituted, preferably, by cadmium and mercury telluride, tin and lead telluride or indium antimonide.

Similarly, substrate 2 is formed preferably from P type silicon in the case of common anode photodiodes. However, it could be formed from N type silicon in the case of common cathode photodiodes or from any other equivalent semiconductor material such as gallium arsenide.

As shown in FIG. 3a, the substrate of photodiodes 1 is biased to a voltage $V_{SD}$ which, in the embodiment shown, is chosen equal to ground. Similarly, substrate 2 on which the transition zone and the charge transfer shift register are formed is biased to a voltage $V_{SM}$ which, in accordance with the present invention, is chosen negative with respect to the voltage of the first substrate. For example, voltage $V_{SM}$ may be chosen equal to $-3$ volts. On the other hand, the transition zone and the shift register are identical to the transition zone and to the charge transfer shift register of the photosensitive device shown in FIG. 1. Consequently, the transition zone has, in a way known per se, diodes D formed by a N diffusion in the P type silicon substrate, a control gate $G_C$ separating the diodes D from the charge storage capacity C formed under gate $G_{ST}$ biassed by a voltage $V_{ST}$ and a transfer gate $G_T$ polarized by a voltage $V_T$ brought alternately to a high level and to a low level which separates the storage zone from stages $G_{CCD}$ of the shift register R.

The base clipping process of the invention will now be described with reference to FIGS. 3b to 3f, 4a and 4b and FIG. 5. As shown in FIG. 3b and in FIG. 5, during time $t_1$, integration of the photoelectrons takes place under the storage gate $G_{ST}$. During this period, the transfer gate $G_T$ is at a low level, i.e. for example at the potential $V_{SM}$ of the second substrate and the charge storage gate $G_{ST}$ is polarized at the high level. The operation is the same as for the base clipping process described with reference to FIGS. 1 and 2. In FIG. 4a it can be seen that the operating point P of the photodiode 1 is located at the intersection of the current-voltage characteristic a of photodiode 1 and that b of the MOS input transistor formed by diode D, the control gate $G_C$ and the storage $G_{ST}$. Usually, the voltage of the operating point $V_P$ is negative and of the order of a few tens of millivolts.

On the other hand, in the embodiment shown, the potential under gate $G_T$ has been chosen negative with respect to biassing voltage $V_{SD}$ of the first substrate but this is optional. In fact, the potential under the transfer gate $G_T$ must be chosen less than or equal to $V_{SD}$.

During time $t_2$, a part $Q_1$ of the charge integrated in the storage zone is transferred under gate $G_{CCD}$ of the shift register R. For that, the potential under the transfer gate $G_T$ is brought to a high level such that the potential under $G_T$ is less than the potential under the storage gate $G_{ST}$ as shown in FIG. 3c. The amount of charges $Q_0$ remaining under the storage gate $G_{ST}$ is therefore only dependant on the relative biassing between the transfer gate $G_T$ and the storage gates $G_{ST}$. This corresponds to the base clipping operation.

As shown in FIG. 3d, the potential barrier under gate $G_T$ is then brought during time $t_3$ to a high level greater than voltage $V_{SD}$. The charge $Q_1$ which has been transferred under gate $G_{CCD}$ of the shift register may then be removed by the charge transfer shift register to the read out stage. Then the potential of the storage gate $G_{ST}$ is lowered during time $t_4$ so that the potential, which would exist under this gate in the absence of a charge, is between $V_{SD}$ and the potential under the transfer gate $G_T$ as shown in FIG. 3e. The charge $Q_0$ is then driven into photodiodes whose biassing points move since the current changes direction in the photodiodes as shown in FIG. 4b. For this operation to be possible, it is then necessary to be able to establish under the storage gate $G_{ST}$ a potential which is negative with respect to the biassing voltage of the first substrate so that charge $Q_0$ may return under the corresponding photodiode and so that under the transfer gate $G_T$ a potential may be established which is even more negative so as to prevent $Q_0$ from being transferred to the shift register. Then, as shown in FIG. 3f, the biassing voltages of the storage gate $G_{ST}$ and of the transfer gate are brought back to the values which they had in FIG. 3b and the next integration cycle begins. The present invention has been described with reference, for the solid state photosensitive device, to a hybrid circuit used in particular in the infrared field. However, as mentioned in the introduction, the present invention may also be applied to a photosensitive device formed on a single semiconductor substrate in which the part of the substrate on which the photodiodes are integrated is separated from the part of the substrate on which the transition zone and the charge transfer shift register are integrated by means of isolating caissons for example, so as to be able to bias these two parts at different voltages. Furthermore, the base clipping process of the present invention may be used in all cases where the useful signal is superimposed on a background charge or pedestal whatever the electromagnetic radiation to be detected.

What is claimed is:

1. In the method of operating photodetecting apparatus which comprises an array of photodetectors which are on a first substrate portion and whose outputs are to be supplied to a shift register by way of separate transition zones which are on a second substrate portion and each of which includes an input MOS transistor formed by a readout diode, a control gate overlying a portion of the second substrate portion, and a charge storage capacitor electrode overlying a charge storage region of the second substrate portion, and a shift register transfer gate, the process of transferring the signal picked up by each photodetector to the shift register to reduce the transfer of background charge comprising the steps of initially biasing at the start of each operating cycle the second substrate portion negatively with respect to the first substrate portion, collecting and integrating signal charge from the photodetector in the charge storage region by way of the readout diode while maintaining the potential of shift register transfer gate low for blocking transfer to shift register, next increasing the potential of the shift register transfer gate for transferring part of the charge in the charge storage region to the shift register, while leaving a remainder portion, next reducing the potential on the shift register transfer gate to be less than the potential of the first substrate portion, and then biasing the potential of the charge storage capacitor electrode so that the potential under said charge storage capacitor is between the bias on the first substrate and the bias on the shift register transfer gate whereby the remainder portion of charge in the charge storage region is essentially returned to the photodector by way of the readout diode.

2. The processs as claimed in claim 1, wherein the potential under the transfer gate during removal of the charge is made equal to the biassing voltage of said second substrate portion.

3. The process as claimed in claim 1, wherein the voltage of said first substrate portion is equal to ground potential.

4. The process as claimed in claim 1, wherein said photodetectors, said transition zone and said shift register are formed on the same chip separated into a first and second substrate portion by isolating means.

* * * * *